United States Patent
Worm et al.

(10) Patent No.: US 8,524,008 B2
(45) Date of Patent: Sep. 3, 2013

(54) METHOD AND DEVICE FOR CLEANING SUBSTRATES ON A CARRIER

(75) Inventors: Sven Worm, Schopfloch (DE); Reinhard Huber, Freudenstadt-Dietersweiler (DE)

(73) Assignee: Gebr. Schmid GmbH (DE)

( * ) Notice: Subject to any disclaimer, the term of this patent is extended or adjusted under 35 U.S.C. 154(b) by 0 days.

(21) Appl. No.: 13/355,223

(22) Filed: Jan. 20, 2012

(65) Prior Publication Data

US 2012/0118329 A1    May 17, 2012

Related U.S. Application Data

(63) Continuation of application No. PCT/EP2010/060644, filed on Jul. 22, 2010.

(30) Foreign Application Priority Data

Jul. 20, 2009  (DE) .............. 10 2009 035

(51) Int. Cl.
B08B 3/04  (2006.01)

(52) U.S. Cl.
USPC ... 134/25.1; 134/22.1; 134/22.11; 134/22.12; 134/22.18; 134/23; 134/25.4; 134/32; 134/34; 134/36; 134/42; 134/147; 134/148; 134/151; 134/152; 134/172; 134/175; 134/198; 134/199

(58) Field of Classification Search
USPC ............ 134/22.1, 22.11, 22.12, 22.18, 23, 134/25.1, 25.4, 32, 34, 36, 42, 147, 148, 134/151, 152, 172, 175, 198, 199
See application file for complete search history.

(56) References Cited

U.S. PATENT DOCUMENTS

| | | | |
|---|---|---|---|
| 5,000,795 A * | 3/1991 | Chung et al. | 134/37 |
| 2008/0295860 A1 * | 12/2008 | Burger | 134/1 |
| 2012/0090651 A1 * | 4/2012 | Geppert et al. | 134/167 C |
| 2012/0132236 A1 * | 5/2012 | Hartmann et al. | 134/156 |

FOREIGN PATENT DOCUMENTS

| | | |
|---|---|---|
| DE | 19900671 A1 | 7/2000 |
| DE | 102008053596 A1 | 4/2010 |
| GB | 2318075 A | 1/1997 |
| JP | 9207126 A | 8/1997 |
| WO | 2010/133682 A1 | 11/2010 |

* cited by examiner

*Primary Examiner* — Bibi Carrillo
(74) *Attorney, Agent, or Firm* — Akerman Senterfitt

(57) ABSTRACT

In the case of a device and a method for cleaning substrates on a carrier, to the underside of which the substrates are fastened so as to be parallel to and slightly apart from one another, the carrier has in its interior a plurality of longitudinal channels, which run parallel to one another. As a result of the sawing of the wafers, they merge, via openings, into interstices between the substrates. As a result of a relative movement, an elongate tube, from which cleaning fluid is let out, is introduced into one of the longitudinal channels, the relative movement being achieved substantially through moving of the carrier.

9 Claims, 1 Drawing Sheet

METHOD AND DEVICE FOR CLEANING SUBSTRATES ON A CARRIER

CROSS-REFERENCE TO RELATED APPLICATIONS

This application is a continuation of PCT Application No. PCT/EP2010/060644, filed Jul. 22, 2010, and claims priority to DE 10 2009 035 343.7 filed Jul. 23, 2009, the disclosures of which are hereby incorporated by reference in their entirety.

FIELD OF APPLICATION AND PRIOR ART

The invention relates to a method for cleaning substrates on a carrier, in particular on a carrier according to the German patent application DE 102009023121, with an application date of 22 May 2009, of the same applicant, and to a corresponding device for performing this method.

It is known from the aforementioned DE 102009023121 that a plurality of flat substrates such as, for example, silicon wafers for the production of solar cells, are arranged on and stuck to a flat, elongate carrier. In its interior, the carrier has a plurality of longitudinal channels, which run parallel to one another and which, on the underside of the carrier, merge, via openings, into interstices between the substrates, or are connected to the interstices in a fluid-conducting manner. In order to introduce cleaning fluid into the longitudinal channels, such that this fluid comes out into the interstices and thereby flushes and cleans the interstices, fluid couplings can be applied directly to the openings of the longitudinal channels for the purpose of feeding-in cleaning fluids. This, however, still does not result in a good cleaning effect.

OBJECT AND SOLUTION

The invention is based on the object of creating a method, stated at the outset, and a corresponding device, by means of which problems of the prior art can be avoided and, in particular, the cleaning effect in as great as possible.

This object is achieved through a method having the features of claim 1 and a device having the features of claim 13. Advantageous and preferred developments of the subject-matter of the invention are disclosed by the other claims, and are explained more fully in the following. In the following, a number of the features are described for the method only or for the device only. Irrespective thereof, however, they are intended to be applicable to both the method and the device. The wording of the claims is made through express reference to the content of the description.

According to the invention, it is provided that an elongate tube is introduced into at least one of the longitudinal channels, advantageously one tube into each of the longitudinal channels of the carrier, through a relative movement. The relative movement in this case occurs between the carrier and the tube, and thus one part can be moved and the other remain motionless. Cleaning fluid or another fluid is then let out into the longitudinal channel from the tube, in particular from its end region, which extends into the longitudinal channel. Advantageously, the relative movement is achieved substantially, or at least also, through moving of the carrier. This means, therefore, that ultimately the tube moves in the longitudinal channel of the carrier and consequently the location at which the cleaning fluid comes out of the tube and thus, as it were, the cleaning-fluid outlet point within the longitudinal channel also moves. Cleaning fluid can therefore be introduced into the longitudinal channel, and therefore into the adjacent interstices, in a targeted manner, this resulting in a more targeted and therefore improved cleaning of the interstices. The advantage of moving at least the carrier in the relative movement consists in that the latter is moved in any case in a through-pass operation through a corresponding installation, in particular from one processing station to another. Thus, the movement means, conveyor belts or roller belts or the like can also be used equally for the relative movement.

It can be provided that, at the start of the cleaning operation, after the front tubes have been introduced into the longitudinal channels, cleaning fluid is introduced into the longitudinal channels through the tubes, being so introduced when the tubes project only to a small extent into the longitudinal channels. This is effected, advantageously, for a period of a few seconds. Cleaning fluid then continues to be introduced into the longitudinal channels through the tubes, while the tubes, with a relative movement, move into the longitudinal channels, towards the other end opening.

Advantageously, a tube extends at least into a central region of the longitudinal channel of the carrier. This therefore means that, during the course of the relative movement, one tube travels over the entire length of the longitudinal channel, and consequently one tube is sufficient for cleaning the latter. Alternatively and preferably, however, two groups of tubes are provided, namely, a front tube and a rear tube, which engage in the longitudinal channel at the two opposite ends of the latter and then each extend somewhat over the central region only during the relative movement. The advantage of such an arrangement consists in that, if only a single tube were used, the other end opening of the longitudinal channel would actually have to be closed, in order that excessive cleaning fluid does not emerge ineffectually there. Furthermore, a doubled cleaning effect, as it were, is obtained, since now two tubes introduce cleaning fluid into the longitudinal channel, thus into the interstices.

The introduction of the tubes into the longitudinal channels can be such that in each case a group of adjacently located tubes, in particular as many tubes as longitudinal channels, are fastened to a tube mount or the like, and can be moved or swivelled into the movement path of the carrier, such that this movement path can be advanced continuously if need be, including after removal of the tubes. The swivelling of the tubes into the movement path of the carrier is effected, advantageously, in such a way that the longitudinal central axes of the tubes are in alignment with the longitudinal central axes of the longitudinal channels, and can thus move into the carrier. If the previously described division into front tubes and rear tubes is provided, the carrier is first advanced to the front tubes to the maximum extent. The rear tubes, on their tube mount, are then swivelled into the movement path, such that they likewise are in alignment with the longitudinal channels. The carrier can then be moved back again and the rear tubes likewise thereby move into the longitudinal channels. The distance from the front tubes to the rear tubes should not be excessive, for example a few centimetres, or approximately 10% to 30% of the length of the tubes. Once all tubes have been inserted in the longitudinal channels of the carrier, the carrier is moved slowly back and forth, while cleaning fluid emerges from the tubes to clean the interstices. Advantageously, in this case the tubes are fixed, or motionless, such that only the carrier moves during the main cleaning.

In respect of the tube mounts, it is to be stated that all tubes mounted thereon, thus, for example, the group of front tubes and the group of rear tubes, are connected to a single fluid coupling. This simplifies the connection and operation of the tubes.

If it is required that, for example, more or less cleaning fluid is to be let out at the middle tubes, their specific flow cross-sectional area can be altered. This can be effected either at the coupling of the tube, along its course or at the openings of the tube for outlet of the cleaning fluid.

In addition to merely a swivel capability in a plane perpendicular to the direction of movement of the carrier, a certain movement capability along this direction can be provided for the tube mount of the rear tubes, or those tubes that are the last to be introduced into the longitudinal channels. The carrier then does not need to be advanced so far to the front tubes, or the latter do not need to be so long that they extend to just in front of the other end openings.

The openings of the tubes are advantageously located in their end regions, and go downwards, or are directed downwards. In a simple design, it suffices if recesses are made in the tubes, which advantageously have a round cross-section. These recesses can be either elongate slots or elongate openings, for example of a length of 1 cm to 7 cm. Alternatively, a plurality of openings can be provided, advantageously, again, as simple holes. Each of these openings can be a few millimetres in size. Elaborate nozzle shapes or the like are not absolutely necessary for the tubes, although they are conceivable, since the cleaning fluid only has to emerge in a substantially simple manner in order then to flush, or clean, the interstices between the substrates on the carriers.

On the one hand, it is possible for cleaning fluid to emerge also at the front faces of the tubes, in particular in order to achieve a cleaning effect in the region between the front and the rear tubes. On the other hand, it is advantageous if the frontal ends of the tubes are closed, such that the outlet cleaning fluid is let out while already being directed downwards towards the interstices. This reduces the total consumption of cleaning fluid, or increases the cleaning effect achieved.

In addition to being disclosed by the claims, these and further features are also disclosed by the description and the drawings, the individual features each being realizable on its own, or multiply, in sub-combination form, in the case of an embodiment of the invention and in other domains, and can constitute embodiments that are advantageous and protectable per se, for which protection is claimed here. The subdivision of the application into individual sections and sub-headings does not limit the universal validity of the statements made under these sections and sub-headings.

BRIEF DESCRIPTION OF THE DRAWINGS

Exemplary embodiments of the invention are represented schematically in the drawings and explained more fully in the following. In the drawings.

DETAILED DESCRIPTION AND EXEMPLARY EMBODIMENTS

Figure 1:
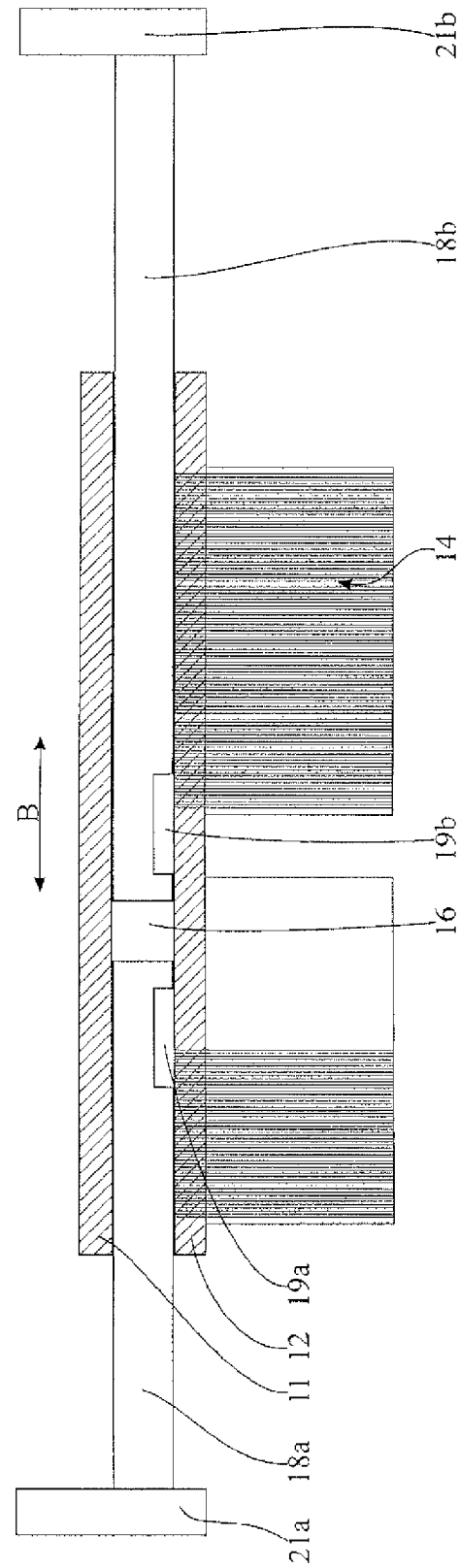
FIG. 1 shows a lateral sectional representation of a carrier having substrates on its underside, and having longitudinal channels, into which tubes are inserted from both sides.

FIG. 1 shows, in lateral section, how a multiplicity of substrates 14 are suspended on the underside 12 of a carrier 11 that is known in principle. These substrates have been produced by sawing silicon blocks. This is general knowledge to persons skilled in the art, and therefore need not be explained in greater detail. The carrier 11, together with the substrates 14, is transported, in a manner not represented in greater detail, along the direction of movement B indicted by the double arrow, for example from left to right. For this purpose, it can be constrained, for example, in a carrier device, such as that known from DE 102008053596 A1. This carrier, in turn, is transported lying on a roller conveyor or the like. As is known from the said DE 102009023121, in the carrier 11 there are longitudinal channels 16, which are cut into from the underside 12 when the silicon blocks are being sawn up into the substrates 14 and, through the openings, a connection is thus produced between longitudinal channels 16 and interstices between the substrates 14. For the purpose of cleaning the substrates 14 or, principally, flushing sawing residues out of the substrate interstices, a fluid, in particular water or cleaning fluid, can then be introduced into the longitudinal channels 16, advantageously from the ends. This fluid then flows out of the longitudinal channels 16 through the sawn-in openings and then between the substrates 14 to achieve the said wanted cleaning effect.

According to the invention, for a more targeted cleaning effect, in particular in order that the fluid does not come out of the longitudinal channels 16 over their entire length and down into the substrates 14 in an uncontrolled manner, the elongate tubes 18a and 18b are provided. The latter are somewhat smaller than the cross-section of the longitudinal channels 16 and, close to an end region, have downwardly directed openings 19a and 19b. In FIG. 1, these openings 19 are realized as elongate slots, and thus as relatively large openings. They cause fluid to come out of the tubes 18 downwardly, over the length of the openings 19, and consequently in this region considerably more fluid can be used for cleaning the substrates 14 than over the entire length of the longitudinal channels. Concentrated, or targeted, outlet of cleaning fluid and, consequently, a more targeted and more concentrated cleaning of the interstices, or substrates 14, can thus be achieved.

Figure 3:
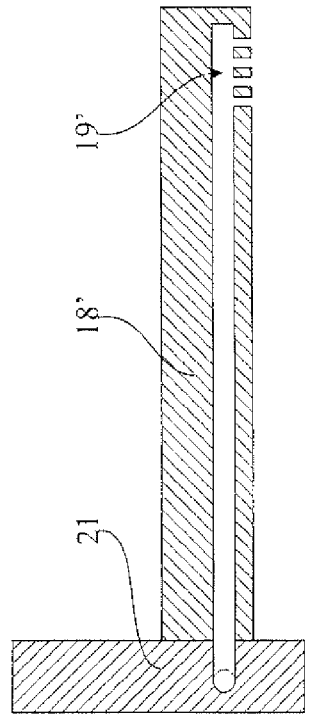
FIG. 3 shows an enlargement through an elongate tube on a carrier, having a plurality of outlets at its end.

It is evident from the modification according to FIG. 3 that, in the case of the tube 18', a plurality of openings 19' are provided close to its end region. This enables fluid to be let out in a yet more targeted manner, in particular at a higher pressure. Thus, the fluid penetrates into the interstices between the substrates 14 for the purpose of cleaning, not only as a result of its weight, as in FIG. 1, but at high velocity, for a yet better cleaning effect.

For persons skilled in the art, it is clear that there are multiple possibilities here for modifying the configuration of the openings 19, for example also a mixture of rather small holes, for example square or round holes, and longitudinal and transverse slots. It is considered advantageous if all openings are directed substantially downwards, i.e. directly onto the substrates 14, or the openings produced by sawing into the underside 12 of the carrier 11. Finally, it is also possible to provide an outlet opening in the front face of the end region of the tube 18.

Figure 2:
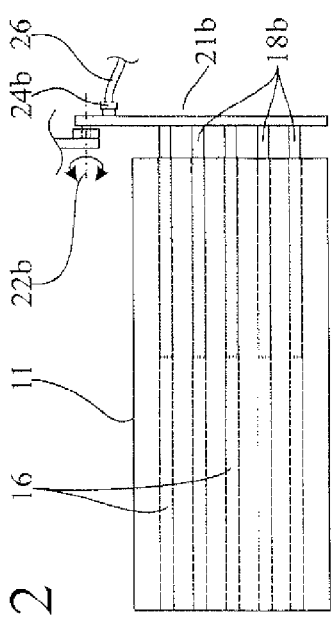
FIG. 2 shows a top view of the representation from FIG. 1, with tubes on a mount at the right side of the carrier.

It can be seen from the top view in FIG. 2 that the tubes 18b on the right are fastened to a tube mount 21b. The tube mount 21b is realized in the manner of an arm, being thus realized so as to be swivelable about a rotational axis 22b. A drive is not represented here, but nevertheless is easily realized. The rotational axis 22b runs parallel to the direction of movement B of the carrier 11.

Fluid is fed to the tubes 18b via a fluid connection 24b on the tube mount 21b, by means of a fluid line 26. It can be provided in this case that the rotational axis 22 runs through the fluid connection 24b and, consequently, if the fluid connection 24b is realized so as to be rotatable, the tube mount 21b is rendered sufficiently movable, or rotatable, without a large resource expenditure.

The tubes 18a on the left according to FIG. 1 are provided, advantageously, on a tube mount 21a realized in a similar or mirror-image manner relative to the tube mount 21b. It can also be seen from the top view from FIG. 2 that the carrier 11 has five longitudinal channels 16, and an equal number, and therefore five, tubes 18a and 18b are provided on the left and right in each case. Fluid for cleaning can then be introduced through each of the longitudinal channels 16 simultaneously.

In order to commence the cleaning operation, it can be provided that the tube mount 21a on the left, with the tubes 18a, is folded up, or swivelled out of the direction of movement B of the carrier 11 together with the substrates 14 and the possible carrier device, in such a way that they do not impede its movement. The tube mount 21b on the right, with the tubes 18b, can already be swivelled into the position represented in FIG. 1, such that, as it were, the carrier 11, with its longitudinal channels 16, can advance to tubes 18b. The tube mount 21a on the left can then be moved towards the carrier 11 in such a way that its tubes 18a engage from the left in the longitudinal channels 16, as represented. According to FIG. 1, for example, this is not solely a swivelling motion about a swivel axis, parallel to the direction of movement B, but a swivelling and travelling motion. The advantage in this case then consists in that, ultimately, as a result of this somewhat complicated movement, the end regions of the tubes 18a and 18b are relatively close to one another. As a result, upon the carrier 11, together with the substrates 14, subsequently being moved back and forth according to the direction of movement B, cleaning fluid is applied from the tubes 18 to all longitudinal regions of the longitudinal channels 16.

Alternatively, should the tubes 18a on the left, as also the tubes 18b on the right, be such that they can be advanced onto the carrier solely by a swivelling motion, the tubes would have to be considerably longer, such that a tube 18 is almost as long as a longitudinal channel, in order that, in the case of the carrier 11 being fully extended, or in the case of the carrier 11 being advanced as far as the tube mount, the other tubes can be swivelled thereto and are not at an excessive distance from the tubes already inserted.

It is evident, from the representation of the figures, that it is particularly advantageous if tubes 18a and 18b engage from both sides in the longitudinal channels 16. The cleaning effect is thereby, as it were, doubled. However, it is also considered to be sufficient to provide, for example, only the tubes 18b on the right, which then, clearly, must be correspondingly longer, such that they, with their openings 19b, can travel along the longitudinal channels 16 in their entirety.

The invention claimed is:

1. A method for cleaning substrates on a flat, elongate carrier, said substrates being fastened by adhesive bonding, through outside faces, to an underside of said carrier so as to be parallel to and apart from one another, said carrier having in its interior a plurality of longitudinal channels, which run parallel to one another and which, on said underside of said carrier, merge into interstices between said substrates, the method comprising the steps of:
   introducing an elongate tube into at least one of said longitudinal channels through a relative movement of the elongate tube and the carrier, and
   in a following step, supplying cleaning fluid to said elongate tube and supplying the cleaning fluid from said elongate tube into said longitudinal channels and to said substrates, the cleaning fluid acting to clean said substrates and flushing through said interstices,
   wherein said relative movement is achieved substantially through moving of said carrier.

2. The method according to claim 1, wherein said elongate tube is introduced into said longitudinal channel at least as far as a central region of said carrier.

3. The method according to claim 1, further comprising a plurality of said elongate tubes introduced in corresponding alignment into a through-pass path of said carrier by a through-pass processing installation as front tubes and, through moving of said carrier, said front tubes are moved into said carrier.

4. The method according to claim 3, wherein when starting a cleaning operation, said carrier advances to said front tubes to a maximum extent on one side and then, on a second side, corresponding second tubes are moved thereto and positioned in such a way that said second tubes are opposite said front tubes and extend to just in front of said carrier.

5. The method according to claim 3, wherein, after said front tubes have been introduced into said longitudinal channels, said cleaning fluid is introduced into said longitudinal channels through said front tubes.

6. The method according to claim 3, wherein said front tubes are introduced into all of said longitudinal channels of said carrier.

7. The method according to claim 3, wherein said front tubes are closed along their length except, having at least one outlet opening.

8. The method according to claim 7, wherein at least one of said outlet opening is open only downwardly towards said substrates.

9. The method according to claim 3, wherein each of said front tubes are connected on one side to a common fluid infeed and supplied jointly with said cleaning fluid.

* * * * *

UNITED STATES PATENT AND TRADEMARK OFFICE
CERTIFICATE OF CORRECTION

PATENT NO.         : 8,524,008 B2                                                                Page 1 of 1
APPLICATION NO.    : 13/355223
DATED              : September 3, 2013
INVENTOR(S)        : Sven Worm and Huber Reinhard It is certified that error appears in the above-identified patent and that said Letters Patent is hereby corrected as shown below:

On the title page

Item (30)
In the "Foreign Application Priority Data" section, please replace "July 20, 2009" with
--July 23, 2009--

Item (30)
In the "Foreign Application Priority Data" section, please replace "10 2009 035" with
--10 2009 035 343.7--

Signed and Sealed this
Fifteenth Day of April, 2014

Michelle K. Lee
*Deputy Director of the United States Patent and Trademark Office*